United States Patent [19]

Wu

[11] Patent Number: 4,617,193
[45] Date of Patent: Oct. 14, 1986

[54] PLANAR INTERCONNECT FOR INTEGRATED CIRCUITS

[75] Inventor: Andrew L. Wu, Shrewsbury, Mass.

[73] Assignee: Digital Equipment Corporation, Maynard, Mass.

[21] Appl. No.: 505,046

[22] Filed: Jun. 16, 1983

[51] Int. Cl.$^4$ .................. B05D 3/06; B05D 5/12; B44C 1/22; G03C 15/00

[52] U.S. Cl. ........................... 427/38; 156/643; 156/662; 357/50; 357/71; 427/86; 427/88; 427/96; 427/259

[58] Field of Search .............. 156/643, 654, 655, 657, 156/662, 650–653; 427/38, 86, 88, 89, 96, 259; 357/50, 71

[56] References Cited

U.S. PATENT DOCUMENTS

| | | | |
|---|---|---|---|
| 3,985,597 | 5/1975 | Zielinski | 427/90 X |
| 4,367,119 | 8/1980 | Logan et al. | 156/643 |
| 4,430,153 | 2/1984 | Gleason et al. | 156/643 |
| 4,451,326 | 5/1984 | Gwozdz | 156/643 |
| 4,457,820 | 7/1984 | Bergeron et al. | 204/192 E |
| 4,460,435 | 7/1984 | Maa | 156/643 |
| 4,474,642 | 10/1984 | Nakane et al. | 156/643 |
| 4,484,979 | 11/1984 | Stocker | 156/643 |
| 4,489,101 | 12/1984 | Shibata | 427/39 |

OTHER PUBLICATIONS

L. B. Rothman, "Process for Forming Passivated Metal Interconnection System with a Planar Surface", J. Electrochemical Society: Solid–State Science and Technology, vol. 130, No. 5, May 1983.

Primary Examiner—Michael R. Lusignan
Attorney, Agent, or Firm—Cesari and McKenna

[57] ABSTRACT

An integrated circuit having a plurality of devices on a substrate is disclosed, wherein a plurality of metallization layers, separated by a plurality of insulating layers, are used to interconnect the devices. Each metallization layer is recessed in an upper portion of a corresponding dielectric layer. A metallization layer is connected to a lower one, or, in the case of the first metallization layer, to the devices, by solid contacts extending through via windows in the lower portion of the corresponding dielectric layer. A method of manufacturing such an integrated circuit is also disclosed, whereby each layer is formed in two steps. First, the lower portion of the insulating layer is deposited, the contact pattern opened and the vias windows filled with metal to provide contacts even with the top surface of the lower portion of the insulating layer. Then, the upper portion of the insulating layer is deposited over the lower portion, the metallization pattern opened, and the pattern filled with metal up to and even with the top surface of the upper portion of the insulating layer. The metal filling step is produced by depositing a metal layer over the corresponding portion of opened insulating layer, masking the opened regions and selectively and directionally removing the unprotected metal layer.

9 Claims, 10 Drawing Figures

PLANAR INTERCONNECT FOR INTEGRATED CIRCUITS

BACKGROUND OF THE INVENTION

This invention relates generally to semiconductor devices having conductor-insulator layers formed thereon and more specifically to integrated circuits having dense multilayer metallization. The invention also relates to a method of manufacturing such semiconductor devices and integrated circuits.

As the number of devices on an integrated circuit increases, the complexity of interconnecting the devices often exceeds the capability of providing a corresponding interconnecting pattern on a single conductive layer. Thus the denser integrated circuits have now required the use of two or more conductive layers to provide the required interconnections, with the two or more conductive layers being separated, except for small portions thereof that are electrically interconnected, by an electrically insulating layer. Usually the interconnecting conductive layers are formed of metal in order to reduce the electrical resistance of the conductive layers or lines.

One problem that has been well recognized in, for example, double metal layer devices is the lack of reliability in obtaining continuity of the upper layer metal and integrity of the dielectric insulating layer over the steps formed by the first layer metallization pattern. The problem arises from the difficulty in maintaining an adequately thick metal layer and a stress-free dielectric insulating layer over a step. Moreover, the step edge tends too form voids that can trap an unwanted substance and cause contamination and reliability problems.

A semiconductor device described in U.S. Pat. No. No. 4,360,823, issued Nov. 23, 1982 to VanGils, attempts to address this problem by partially sinking the first metallization pattern into a first insulating layer. The top surface of the first metallization pattern appears to coincide substantially with that of the first insulating layer. The first metallization pattern and the first insulating layer are covered with a second insulating layer and a second metallization pattern is provided on top of the second insulating layer. However, only the second metallization pattern is connected to the semiconductor zones of the semiconductor body via contact windows that extend through the second insulating layer.

A significant disadvantage of this device is that the first metallization pattern is not electrically connected to any of the active semiconductor regions. This means that the circuit layout freedom is strictly and severely limited. For high-packing-density VLSI circuits this limitation is not easily tolerated.

A further disadvantage is that the method disclosed to deposit the aluminum metal layer into the grooves formed by the apertures of the pattern is only applicable to a large aperture. For dense circuits having a geometry size of the order of two (2) micrometers or less, the disclosed method may result in voids in the deposited aluminum within the groove, with conventional metal deposition techniques.

Another disadvantage is that the method disclosed in the above identified patent of selectively removing the metal layer while still leaving the grooves filled is not easily reproducible due to the difficulty of controlling this method.

A still further disadvantage is that this device is limited to only two metallization layers, since a third layer disposed over the uneven surface of the second metal layer will produce the same problems as those discussed above.

An additional problem typical of present day devices using two conductive interconnection layers is the difficulty of defining small metal pitch. Pitch is here defined as the sum of the width of the metal line and its separation from an adjacent line as seen in a plan view. Lift-off techniques have been used to define a smaller pitch, however, there are serious problems in controlling the process to insure repeatability. For example, the pitch that can be achieved using lift-off techniques is limited to no less than 3 micrometers. In general, the width of the metal lines will be limited by the photolithographic techniques which define the pattern. Also, the thickness of the conductive layer will be limited by the step discontinuities over which the patterned metal passes, Thus, a need exists to provide a structure and process which allows an increase in the complexity and yield using metal interconnections in integrated circuits.

SUMMARY OF THE INVENTION

It is an object of the subject invention to provide an integrated circuit having a dense multilayer metallization. More specifically, it is an object of this invention to provide an improved co-planar composite electrical conductor-insulator layer which avoids the problems of the prior art. It is a further object of the present invention to provide a method to fabricate dense multilayer metallization for integrated circuits.

The present invention provides patterns recessed by anistropic reactive ion etching (referred to as PRAIRIE) for a dense multilayer metallization interconnecting a plurality of semiconductor devices in a semiconductor substrate. A first metallization layer is recessed on an upper portion of a first insulating layer disposed over the substrate containing said plurality of devices.

The upper surface of the first metallization layer is aligned with the upper surface of the insulating layer. The metallization layer is connected to selected devices by solid contacts extending through windows in a lower portion of the insulating layer. A second insulating layer is disposed over the first, and a second metallization layer is recessed in an upper portion therein and connected, through contacts provided in a lower portion of the second insulating layer, to the first metallization layer in selected regions. Any desired number of additional metallization layers may be provided, each recessed within a corresponding insulating layer, and connected to a lower one by contacts extending through windows in the corresponding insulating layer.

The present invention also provides for a method of manufacturing such a multilayer metallization integrated circuit. The present method starts with a substrate in which a plurality of devices have been fabricated by any conventional method. It then provides for the fabrication of a substantially planar surface for each insulating layer, and corresponding metallization layer recessed therein, in two steps. First, a first portion of the insulating layer is deposited and metal contacts are formed therein, then a second portion of the insulating layer is deposited on top of the first and the metallization layer is formed therein. The forming of the contacts and the forming of the metallization layer are each achieved by etching the required pattern, either for contact or metallization, on the respective (first or second) insulating layer portion; depositing a metal layer over the resulting surface to fill the wells formed between adjacent steps; planarizing the surface of the metal layer by spinning on a low viscosity photoresist; selectively and directionally etching the photoresist to the plane of the metal projections that are formed, whereby the metal layer wells are still filled with a portion of the photoresist; selectively and directionally etching the metal to the plane of the projections of the insulating layer portion that are formed, thus leaving the etched pattern filled with metal; and removing the photoresist left over the filled wells. Preferably, the selective and directional (i.e. anisotropic) etching is carried out by a reactive-ion-etcher.

The dense multilayer metallization provided by the present invention has the advantage of allowing a high packing density and a greater design freedom in placing the active components on the substrate.

The method disclosed can be used to produce metallization lines having a width of the order of two (2) micrometer or less, thus obtaining small metal pitch.

By using the process of the present invention for each layer, the prior art problem of depositing a uniform layer of metal or insulator over a step is avoided and, since each portion of dielectric layer is deposited on a composite metal-insulator co-planar surface, the prior art stress related problems associated with depositing a dielectric over a step are also avoided.

BRIEF DESCRIPTION OF THE DRAWINGS

A better understanding of the present invention may be obtained from the accompanying description used in conjunction with the drawings in which.

DETAILED DESCRIPTION OF THE INVENTION

FIGS. 1A through 1I show the various steps that comprise the method of manufacturing a interconnection layer of the present invention.

Figure 1A:
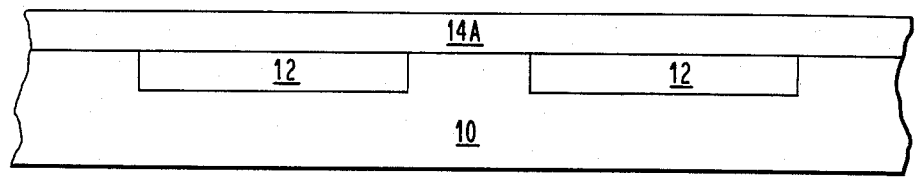
FIGS. 1A–1I, show in cross-section, various stages of forming composite ideally co-planar electrical interconnection patterns on an ideally planar substrate during the multilayer metal-insulator processing of the present invention.

Referring now to FIG. 1A, there is shown a semiconductor substrate 10 having a plurality of semiconductor regions or devices 12 (hereinafter "regions"). For simplicity, the top surface of substrate 10 is shown as perfectly planar, even though, as will be explained later, it need not be so. Substrate 10 may comprise a slab of germanium, a Group III–V compound or an insulator. In this example, the substrate is a suitably doped silicon and semiconductor regions 12 comprise appropriately isolated P or N doped regions such as N or P doped silicon. A planarization material is deposited, or otherwise conventionally applied, onto the top surface of the substrate 10. For example, a boro-phosphosilicate glass (BPSG) dielectric material is deposited and then is made to flow at a temperature of preferably about 900° C., to planarize any unevenness present in the top surface of the underlying substrate 10. The planarization material is used as a first portion 14A of the first insulating layer 14 comprised of layers 14A and 14B as hereinafter explained, see FIGS. 1I and 2. The weight percent (wt.%) of boron and phosphorus in BPSG film is preferably approximately 4%.

Figure 1B:
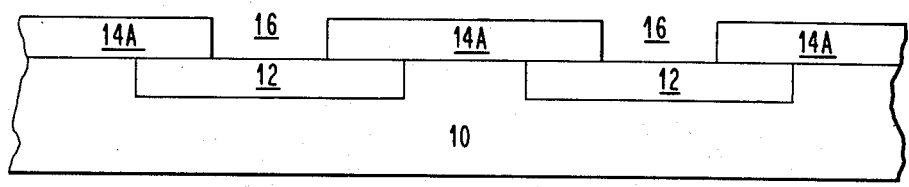

Thereafter, as shown in FIG. 1B, the first group of interlevel vias 16 are formed or provided by means of conventional photolithographic masking and etching or by any suitable photoengraving technique such as chemical etching, plasma etching or, as preferred in this example, reactive ion etching.

Figure 1C:
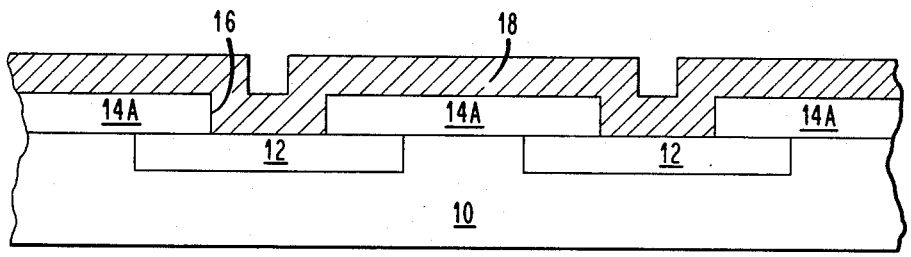

A metal layer 18, such as an aluminum-based alloy (i.e. aluminum copper, aluminum silicon, aluminum-silicon-copper, or an aluminum (with or without silicon)-/barrier metal sandwich material is then deposited by well known semiconductor techniques. The layer 18 is shown in FIG. 1C. The thickness of the metallization layer 18 is greater than or equal to the depth of the vias 16, approximately 0.7 micrometer in this example. Here there is no need to worry about the coverage over the step formed by the portion of the metal material extending from the vias 16 over the top edge of each of the vias, since, as will be explained below, the only portion of metal layer 18 that is finally retained is that deposited into vias 16.

Figure 1D:
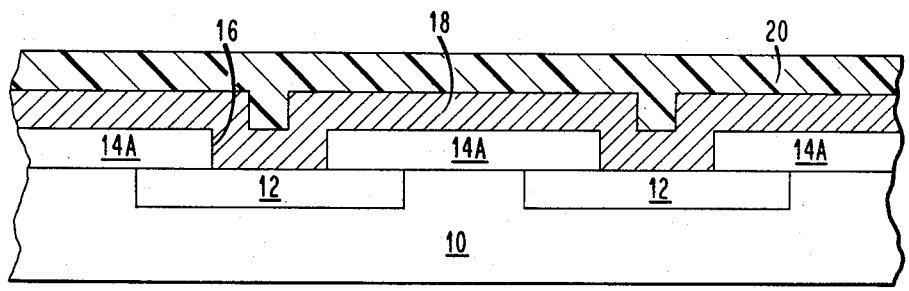

Metal layer 18 conforms to the profile of the surface over which it is deposited, thus it will form wells over the vias 16. As shown in FIG. 1D, a layer 20 of preferably low viscosity material is deposited or placed over the metal layer 18 so that the low viscosity material 20 fills the wells over the vias in order to planarize the top surface. For example a quantity of KTI Pos II photoresist, available from KTI Chemicals Inc., California, is placed over metal layer 18 and is spun on to provide a 2.0 micrometer thick layer, with the well regions being thicker by an amount equal to the well depth.

Figure 1E:
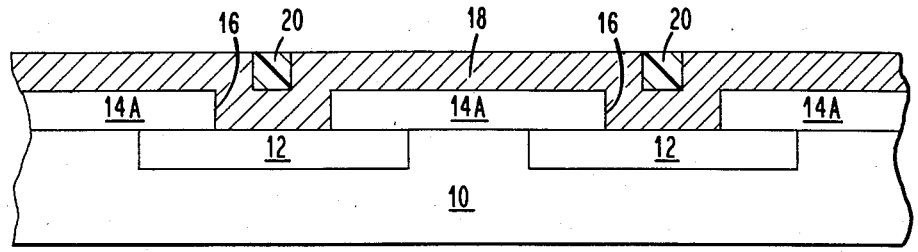

Referring to FIG. 1E, a reactive ion etcher, for instance model AME 8110 manufactured by Applied Materials in California, is now used to etch away stratal portions of the low viscosity layer 20. Reactive ion etching is used to control the characteristics of the etching step. The gas and operating parameters used in the reactive ion etcher are selected to provide the needed amounts of anisotropy, i.e. the variation of the etch rate with respect to different direction, and of selectivity, i.e. the variation of the etch rate with respect to different materials. In this step, the anisotropy and selectivity are selected to uniformly remove a thickness of photoresist layer 20 in order to provide a planar composite layer formed by metal layer 18 with the steps filled by the remaining portions of photoresist layer 20, as shown in FIG. 1E. The anisotropy of the reactive ion etching is a function of the angle of incidence of the ion on the surface. In this case, the incident ions are perpendicular to the substrate surface, effectively "grinding" away the exposed surface layer by layer, with no substantial etching away in a direction parallel to the substrate surface. A photoresist selective etching characteristics is achieved by means of oxygen gas with preferably a gas flow rate of 100 cc/min, pressure of 150 millitorr and forward RF power of 700 watts, thereby yielding an etch rate of 1400 A/min for KTI Pos II photoresist 20 and virtually no etching of the metal 18. The combination of anisotropic etching and high selectivity between photoresist and metal by means of the reactive ion etching provides the uniform stratal removal of photoresist 20 and a natural etch stop when the top surface of the metal layer 18 is exposed at the interface of photoresist layer 20 and metal layer 18. A laser end point detector is preferably used to monitor the etching. This is done to stop the etching when the top surface of metal layer 18 is exposed, in order to keep the well portion of metal layer 18 filled with photoresist 20. This results in the structure as shown in FIG. 1E.

Figure 1F:
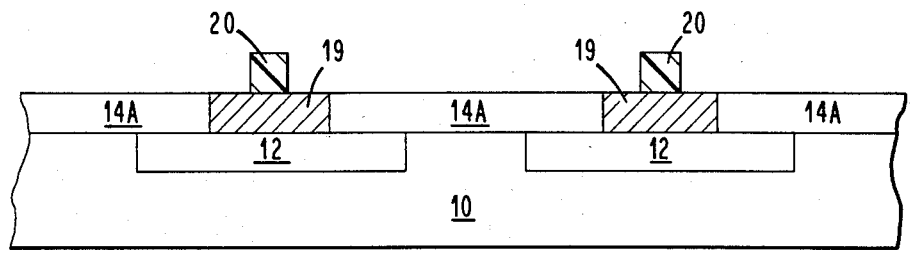

The metal layer 18 is then removed by means of a reactive ion etching from the regions other than the vias 16, as shown in FIG. 1F. That is, the selectivity of the etching is now chosen to etch away the metal 18 but not the photoresist 20, while the anisotropic characteristic of the reactive ions are again used to etch in a direction perpendicular to the exposed surface. In this example, a reactive ion etcher model AME 8130, also manufactured by Applied Material, is preferably used. Here metal layer 18 is an aluminum silicon/TiW sandwich structure. The required selectivity is achieved by means of a $BCl_3+Cl_2$ mixture to etch the aluminum silicon followed by a $CF_4+O_2$ mixture to etch the TiW and to prevent corrosion. The forward RF power is 950 watts, pressure is 20 millitorr and gas flow rates are 115 cc/min ($BCl_3$), 20 cc/min ($Cl_2$), 10 cc/min ($CF_4$) and 5 cc/min ($O_2$), thereby yielding an etch rate ratio of aluminum:KTI Pos II photoresist of typically 3.5:1. The anisotropic etching and selectivity of the reactive ion etching in this step of the process also provide the stratal uniform etching of metal layer 18 and a natural etch stop when the top surface of the dielectric layer 14A is exposed at the interface of metal layer 18 and portion 14A of insulating layer 14 (FIG. 1F). A laser end point detector is again used to monitor and stop the anisotropic etching when the surface of dielectric layer 14A is exposed.

Figure 1G:
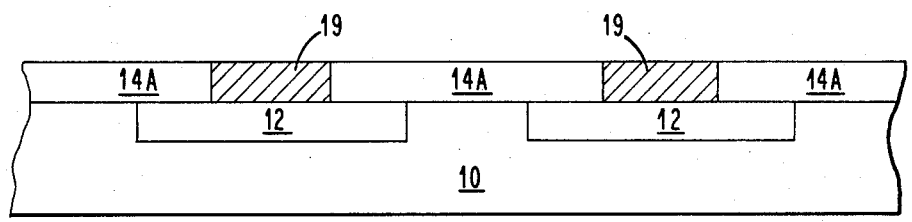

The remaining photoresist regions 20 located over the regions of the vias 16 are then conventionally removed, for instance by means of a dry or wet photoresist strip operation, leaving a set of solid vias 16 filled with metal to serve as metal contacts 19, as shown in FIG. 1G. The top surface of each of the metal contacts 19 coincides with the top surface of the insulating portion 14A, i.e. the resulting composite top surface of the structure shown in FIG. 1G is planar.

Figure 1H:
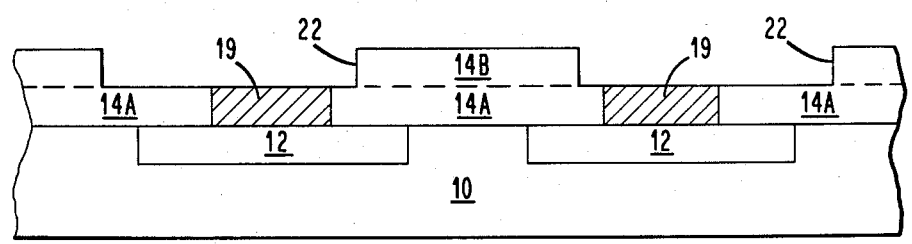
Figure 1I:
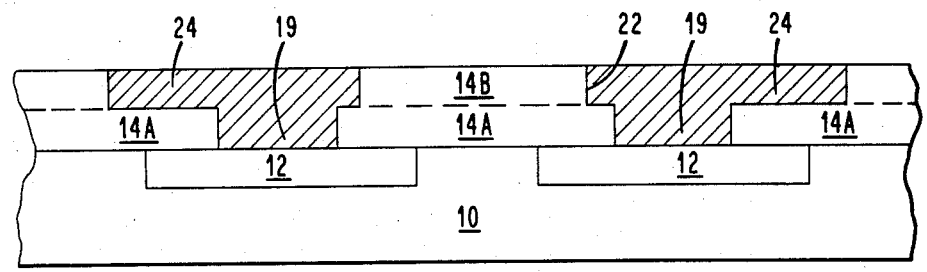

Referring to FIG. 1H, a second portion 14B of the first insulating layer 14 is first deposited and subsequently, a first metallization pattern 22 is formed within insulating portion 14B, without affecting the prior layer, by, for example, using anisotropic etching and a series of processing steps such as by repeating the procedures described in connection with FIG. 1C through FIG. 1G. Thus, referring now to FIG. 1I, a first metallization pattern 22 is defined and a first metallization layer 24 is recessed partially into the first composite insulating layer 14 (comprising layers 14A and 14B). The top surface of the first metallization layer 24 coincides in a continuous manner with that of the first insulating layer 14 thus forming a continuous substantially planar composite surface.

It should be realized that other conductive materials, such as N or P doped polycrystalline silicon, may also be used for the recessed metallization layer.

At this point, the first metallization layer or regions 24 and interlevel contacts 19A and 19B have been provided. The surface remains substantially planarized. By repeating the procedure described in FIG. 1A through FIG. 1I, a dense multilayer metallization integrated circuit with a stress-free dielectric layer electrically insulating each metallization layer can be realized.

Since each metallization layer is fully recessed and is part of a composite planar layer, there is no processing restriction as to the relative layout of the metal lines in adjacent metallization layers. Accordingly, the layout of each metallization layer can be optimized and metal lines in adjacent layers can cross each other at any selected angle.

The width (as seen from a plan view, now shown) of the metal lines of the recessed metallization pattern formed by the method shown in FIG. 1A through FIG. 1I is limited to approximately 15 micrometers or less because of the conformity of material 20 over a wide opening prevents the maintenance of a nominally planar top surface. In a dense multilayer metallization system, all the underlying metallization patterns can be recessed by this technique and used as the interconnections for local signals which normally do not require wide metallization lines. The last metallization pattern can be used as the power bussing and bonding pad which require wide metallization lines and can be formed by a conventional method.

Figure 2:
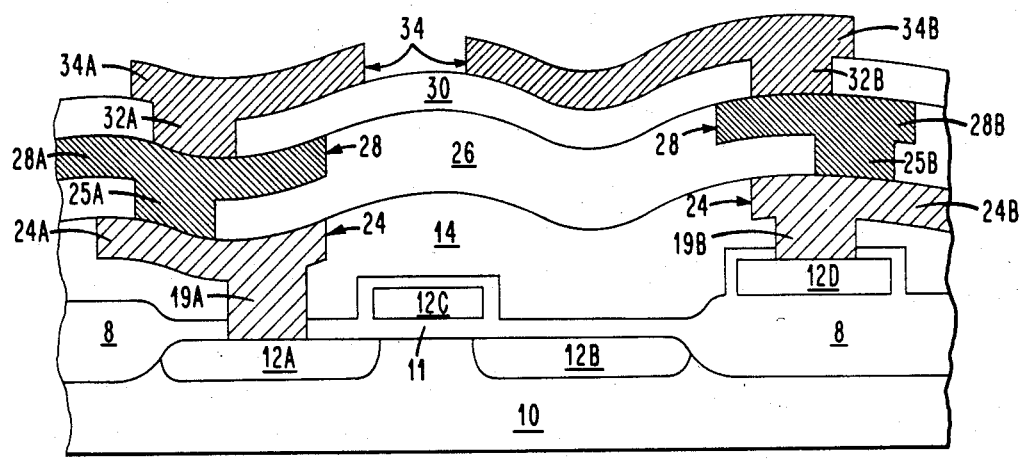
FIG. 2 shows the cross-section of a typical multilayer metallization showing a single MOS device in an integrated circuit embodying the principles of the present invention, and showing, greatly exaggerated for illustration purposes, that the various layers may deviate from an ideal plane and still provide for a smooth composite surface.

FIG. 2 is an example of an integrated circuit using the principles of the present invention. Only one device, a three layer metallization MOS device with semi-recessed field oxide 8, is shown for simplicity. It comprises a P-type substrate 10, a gate dielectric 11 and semiconductor device regions such as N+ source 12A and N+ drain 12B. Electrically conductive layers or regions such as N+ doped polycrystalline silicon gate 12C and interconnect conductor 12D are also provided for connection to other parts of the circuit, not shown. In this example, three layers of metallization, 24 (shown as regions 24A and 24B), 28 (shown as regions 28A and 28B), and 34 (shown as regions 34A and 34B), are insulated by dielectric layers 14, 26, 30. The three metal layers are, respectively, connected by interlevel sets of solid contacts 19 (shown as contacts 19A and 19B), 25, (shown as contacts 25A and 25B), and 32 (shown as contacts 32A and 32B). The third metallization layer 34 may be made or formed with a conventional metal deposition and etching method, as illustrated. The first and second metallization layers, 24 and 28 respectively, are used mainly for signal connection and the third metallization layer 34 for power bussing and as a bonding pad.

It should be understood that a predetermined region of any metal layer can make contact to a predetermined region of any other metal layer by use of a plurality of corresponding interlevel contacts and contact pads located in the intervening metal layers. For example, in FIG. 2., conductive regions 12D is shown connected through contact 19B to region 24B of metal layer 24, with metal layer region 24B being shown on the right of FIG. 2 continuing on to some other part of the integrated circuit. Region 24B of metal layer 24 is connected to region 34B of metal layer 34 through a corresponding interlevel contact 25B in the next higher insulating layer 26, a pad 28B built into metal layer 28, and a corresponding interlevel contact 32B in insulating layer 30. Pad 28B, and others like it, preferably has a cross-section larger than that of corresponding contacts 24B or 32B to ease the alignment requirements between layers.

The unevenness, or undulation, of the surface of each layer in FIG. 2 is shown greatly exaggerated from what is typically achieved to show that each layer, or corresponding portion, need not be perfectly planar to achieve the advantages of the present invention. It should be clear that in any event the discontinuities of the surface, and the corresponding step coverage problems of the prior art, are eliminated. To put it in another way in the context of the present invention a "planar surface" is used to mean a continuous surface having no steps or discontinuities, and is meant to encompass a continuous surface deviating from a nominal plane. This kind of planar surface is achieved by having each layer deposited in a two step process; the first step being used to define the contacts between the current layer and the lower one, and the second step being used to define the current metallization layer. This results in a substantially planar surface for each layer or at least in a surface free of discontinuities, and thus the number of layers that can be provided on an integrated circuit is not limited by the process of the present invention.

One of the advantages of the method of the present invention is that, by using the reactive ion etching process, very fine metal lines can be defined and accurately maintained. This is in contrast to the method described in U.S. Pat. No. 4,360,823, cited above, wherein the line definition that can be maintained is limited by the process.

It will be apparent that the invention is not restricted to the examples described. The substrate 10 may contain a plurality of MOS transistors with either semi-recessed or fully recessed field oxide. It may also comprise a plurality of integrated bipolar transistors with either PN junction isolation or oxide isolation. Other semiconductor materials such as germanium, gallium arsenide, silicon-on-insulator or silicon-on-sapphire may alternatively be used as the starting substrate.

Other modifications to the preferred embodiment will also be apparent to those skilled in the art without departing from the spirit and scope of the present invention. Accordingly, it is intended that this invention be not limited to the embodiments disclosed herein except as defined by the appended claims.

What is claimed is:

1. A method of forming a planar conductor-insulator layer on a surface of an integrated circuit chip comprising the steps of:
    (a) forming an insulating layer on the surface of the integrated circuit chip,
    (b) forming a recess in the insulating layer,
    (c) depositing a layer of conductive material on the insulating layer to a thickness sufficient to fill the recess, thereby leaving a recess in the conductive layer,
    (d) forming a mask by:
        (1) depositing a layer of masking material on top of the conductive layer such that the thickness of the layer of masking material in the region overlying the recess in the conductive layer is greater than in other regions of the masking layer, and
        (2) etching the layer of masking material to expose the top surface of the conductive layer in the regions outside the region overlying the recess in the conductive layer, such that masking material remains in the region overlying the recess in the conductive layer,
    (e) etching the exposed surface of the conductive layer to remove the portion of the conductive layer in regions outside the region of the recess in the insulating layer, thereby to leave the recess in the insulating layer filled with conductive material.

2. The method of claim 1 further comprising the step of removing the mask after etching the conductive layer.

3. The method of claim 1 wherein said etching of the masking material includes anisotropic etching in a direction substantially perpendicular to the surface of the integrated circuit chip.

4. The method of claim 1 wherein said etching of the conductive layer includes anisotropic etching in a direction substantially perpendicular to the surface of the integrated circuit chip.

5. The method of claim 1 wherein the integrated circuit includes a substrate which defines a primary plane, and wherein said step of etching the conductive layer is performed by anisotropic etching in a direction perpendicular to the primary plane.

6. The method of claim 1 wherein the conductor-insulator layer is a first contact layer, the method further comprising steps for forming a second conductor-insulator layer on the first contact layer corresponding to a predetermined pattern layer by the steps of:
    (a) forming, on the first contact layer, a second insulating layer,
    (b) forming a recess in the second insulating layer,
    (c) depositing a second layer of conductive material on the second insulating layer to a thickness sufficient to fill the recess, thereby leaving a recess in the second conductive layer,
    (d) forming a second mask by:
        (1) depositing a second layer of masking material on top of the second conductive layer such that the thickness of the second layer of masking material in the region overlying the recess in the conductive layer is greater than in other regions of the second masking layer, and
        (2) etching the second layer of masking material to expose the top surface of the second conductive layer in the regions outside the region overlying the recess in the second conductive layer, such that masking material remains in the region overlying the recess in the second conductive layer,
    (e) etching the exposed surface of the second conductive layer to remove the portion of the second conductive layer in regions outside the region of the recess in the second insulating layer, thereby to leave the recess in the second insulating layer filled with conductive material.

7. A method of electrically interconnecting a plurality of semiconductor devices on an integrated circuit chip, there being contact locations on the integrated circuit chip for making electrical connections to the devices, the method comprising the steps of:
    (a) forming, on a surface of the integrated circuit chip, a first insulating layer,
    (b) forming, at each contact location, a recess in the first insulating layer,
    (c) depositing a first layer of conductive material on the first insulating layer to a thickness sufficient to fill the recesses, thereby leaving recesses in the first conductive layer,
    (d) forming a first mask by:
        (1) depositing a first layer of masking material on top of the first conductive layer such that the thickness of the first layer of masking material in the region overlying the recesses is greater than in other regions of the first masking layer, and
        (2) etching the first layer of masking material to expose the top surface of the first conductive layer in the regions outside the region overlying the recesses in the first conductive layer, such that masking material remains in the region overlying the recesses in the first conductive layer, (e) etching the exposed surface of the first conductive layer to remove the portion of the first conductive layer in regions outside the regions of the recesses in the first insulating layer, thereby to leave the recesses in the first insulating layer filled with conductive material, (f) forming, on the exposed surface of the material remaining from the preceeding steps, a second insulating layer, (g) forming a plurality of recesses in the second insulating layer, this plurality including recesses each of which overlies at least two of the recesses in the first insulating layer to permit interconnection therebetween, (h) depositing a second layer of conductive material on the second insulating layer to a thickness sufficient to fill the recesses in the second insulating layer, thereby leaving recesses in the second conductive layer, (i) forming a second mask by:
  (1) depositing a second layer of masking material on top of the second conductive layer such that the thickness of the second layer of masking material in the region overlying the recesses of the second conductive layer is greater than in other regions of the second masking layer, and
  (2) etching the second layer of masking material to expose the top surface to the second conductive layer in the regions outside the regions overlying the recesses in the second conductive layer, such that masking material remains in the regions overlying the recesses in the second conductive layer, (j) etching the exposed surface of the second conductive layer to remove the portion of the second conductive layer in regions outside the regions of the recesses in the second insulating layer, thereby to leave the recesses in the second insulating layer filled with conductive material, whereby the conductive material remaining after the preceeding steps forms a pattern of electrical connections among the contact locations.

8. The method of claim 7 wherein the masking material is a low viscosity resist and said steps of depositing a layer of masking material each comprises spinning the resist over the surface the integrated circuit chip.

9. The method of claim 7 wherein all of said etching steps comprise reactive ion etching.

* * * * *